(12) United States Patent
Kristiansen et al.

(10) Patent No.: US 9,052,868 B2
(45) Date of Patent: Jun. 9, 2015

(54) SUBSEA CONTROL SYSTEM

(75) Inventors: Karstein Kristiansen, Trondheim (NO); Kjetil Zsolt Volent, Trondheim (NO)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 107 days.

(21) Appl. No.: 13/876,841

(22) PCT Filed: Feb. 4, 2011

(86) PCT No.: PCT/EP2011/051676
§ 371 (c)(1),
(2), (4) Date: Mar. 28, 2013

(87) PCT Pub. No.: WO2012/041529
PCT Pub. Date: Apr. 5, 2012

(65) Prior Publication Data
US 2013/0182385 A1    Jul. 18, 2013

(30) Foreign Application Priority Data
Sep. 29, 2010   (EP) .................................... 10182039

(51) Int. Cl.
*H05K 1/14*  (2006.01)
*G06F 1/16*  (2006.01)
*H05K 3/30*  (2006.01)
*H05K 7/12*  (2006.01)

(52) U.S. Cl.
CPC   *G06F 1/16* (2013.01); *H05K 1/141* (2013.01); *H05K 3/301* (2013.01); *H05K 7/12* (2013.01); *H05K 2201/10159* (2013.01); *H05K 2201/10325* (2013.01); *H05K 2201/10409* (2013.01); *H05K 2201/10598* (2013.01); *H05K 2201/10606* (2013.01)

(58) Field of Classification Search
USPC .................. 361/726, 740, 748; 257/676–678
See application file for complete search history.

(56) References Cited

U.S. PATENT DOCUMENTS

| | | | |
|---|---|---|---|
| 5,825,089 A * | 10/1998 | Valenti et al. ................. 257/718 |
| 6,241,545 B1 * | 6/2001 | Bricaud et al. ................ 439/326 |
| 6,533,589 B1 | 3/2003 | Palaniappa et al. ............ 439/71 |
| 7,170,750 B2 * | 1/2007 | Tanaka .......................... 361/719 |
| 7,310,227 B2 * | 12/2007 | Kusamoto et al. ............ 361/695 |
| 7,746,653 B2 * | 6/2010 | Negrut .......................... 361/719 |
| 8,120,171 B2 * | 2/2012 | Koike et al. ................... 257/719 |
| 2006/0221573 A1* | 10/2006 | Li .................................. 361/704 |
| 2007/0173957 A1 | 7/2007 | Johansen et al. .................. 700/9 |
| 2009/0304389 A1* | 12/2009 | Joe et al. ....................... 398/115 |

FOREIGN PATENT DOCUMENTS

| | | | | |
|---|---|---|---|---|
| CN | 2760811 Y | 2/2006 | ........... H01R 13/639 |
| DE | 202005018114 U1 | 3/2006 | .............. H01L 25/10 |
| JP | 2004178824 A | 6/2004 | .............. G06K 17/00 |

OTHER PUBLICATIONS

International Search Report and International Preliminary Report on Patentability, Application No. PCT/EP2011/051676, 9 pages, May 25, 2011.

* cited by examiner

*Primary Examiner* — Hung S Bui
(74) *Attorney, Agent, or Firm* — King & Spalding L.L.P.

(57) ABSTRACT

A subsea control system may include a computer unit including a printed circuit board that contains a central processing unit, and a socket for holding at least one memory card, whereby the computer unit has a screw hole, a wedged plate is fixed above at least a part of the socket by a screw which is screwed into the screw hole for fixing the at least one memory card placed in the socket.

11 Claims, 1 Drawing Sheet

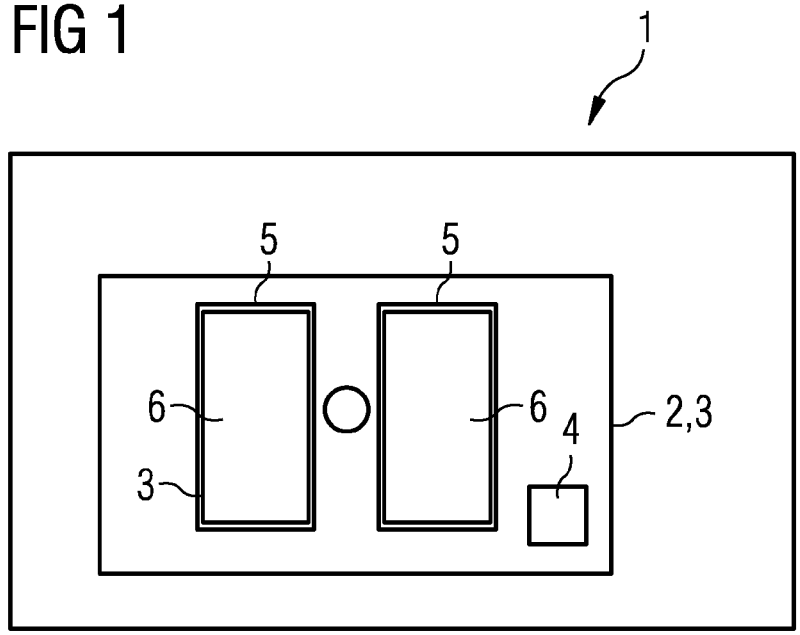
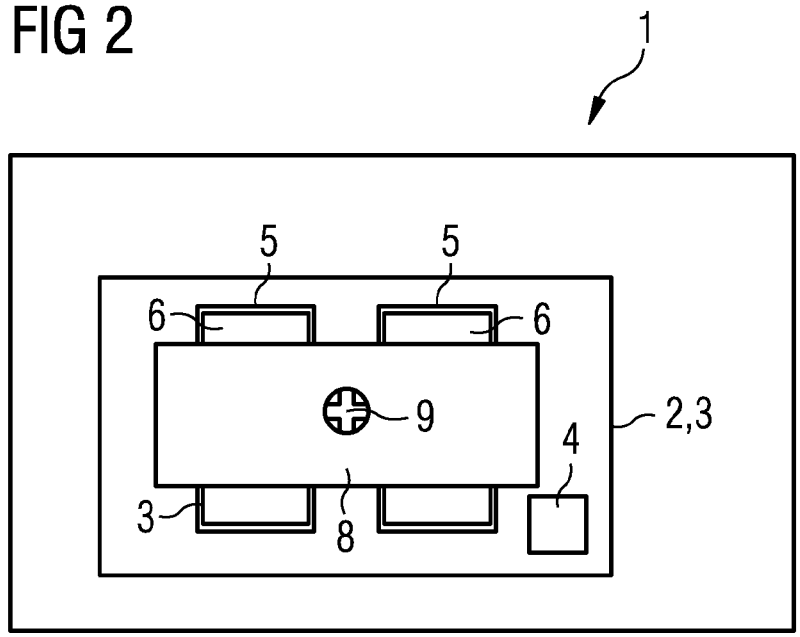

SUBSEA CONTROL SYSTEM

CROSS-REFERENCE TO RELATED APPLICATIONS

This application is a U.S. National Stage Application of International Application No. PCT/EP2011/051676 filed Feb. 4, 2011, which designates the United States of America, and claims priority to EP Patent Application No. 10182039.7 filed Sep. 29, 2010 The contents of which are hereby incorporated by reference in their entirety.

TECHNICAL FIELD

The disclosure relates to a subsea control system with a computer unit, the computer unit comprising a printed circuit board that contains a central processing unit and the computer unit comprising a socket for holding at least one memory card.

BACKGROUND

Future subsea processing facilities will grow to include several electrically driven pumps and gas compressors to transport oil or gas over very long distances. Therefore subsea power grids are able to operate in depth of 2000 or more meters of total reliability withstanding extreme pressure and harsh temperatures. Such a subsea power grid comprises several subsea control systems which are systems for collecting data subsea or controlling other subsea devices. Within a subsea control system, it is a task to prevent a memory card of falling out of its socket at the subsea control system.

Up to now this problem of fixing a memory card in a subsea control system has been solved by gluing the memory card to the subsea control system. That means, to keep a memory card in place at subsea control systems glue has been the used solution. The disadvantage of gluing the memory card to the subsea control system is that vibrations or shocks resolve the connection of the memory card to the subsea control system, so that the memory card can fall out of the socket at the subsea control system.

SUMMARY

One embodiment provides a subsea control system with a computer unit, the computer unit comprising a printed circuit board that contains a central processing unit and the computer unit comprising a socket for holding at least one memory card, wherein the computer unit has a screw hole and that a wedged plate is fixed above at least a part of the socket by a screw which is screwed into the screw hole for fixing the at least one memory card placed in the socket.

In a further embodiment, the screw hole is part of the printed circuit board of the computer unit.

In a further embodiment, two sockets are arranged next to each other and that the screw hole is arranged next to both sockets for fixing two memory cards each placed in one of the sockets.

In a further embodiment, the screw hole is arranged between the two sockets.

In a further embodiment, the wedged plate wedges the at least one memory card in the socket.

In a further embodiment, two or more screws are screwed in a second or further screw hole for fixing the at least one memory card placed in the socket(s).

In a further embodiment, the wedged plate is sealing the at least one memory card in the socket.

In a further embodiment, the at least one memory card is a PC Card, like a CompactFlash Card, a Smart Card, a Miniature Card, a Secure Digital Card.

In a further embodiment, the subsea control system is embedded into a pressure-proof housing.

In a further embodiment, the wedged plate is a bent plate which is arranged to apply a continuous tensioning force to the at least one memory card.

In a further embodiment, the wedged plate is bent in L-form or in V-shape.

BRIEF DESCRIPTION OF THE DRAWINGS

Exemplary embodiments will be explained in more detail below on the basis of the schematic drawings, wherein:

FIG. 1 shows a subsea control system according to an example embodiment, without a wedged plate, and FIG. 2 shows the subsea control system according to FIG. 1, with a wedged plate.

DETAILED DESCRIPTION

Embodiments of the present disclosure provide a subsea control system with at least one memory card, which makes sure that the at least one memory card is prevented of falling out of its socket at the subsea control system. Thus, some embodiments provide a very robust subsea control system which ensures a save hold of a memory card at the subsea control system.

For example, some embodiments provide a subsea control system with a computer unit, the computer unit comprising a printed circuit board (PCB) that contains a central processing unit (CPU) and the computer unit comprising a socket for holding at least one memory card, whereby the computer unit has a screw hole and whereby a wedged plate is fixed above at least a part of the socket by a screw which is screwed into the screw hole for fixing the at least one memory card placed in the socket. The computer unit comprises a CPU card which is a printed circuit board (PCB) that contains a central processing unit (CPU). Such CPU cards are specified by CPU clock frequency and bus type as well as other features and applications built in to the card. The at least one memory card is placed into the socket and fixed by a wedged plate which is fixed to the computer unit. Therefore the computer unit comprises the screw hole. The wedged plate is fixed above the socket by a screw which is screwed into the screw hole, so that the at least one memory card which is placed in the socket is covered by the wedged plate. Such a fixation of the at least one memory card at the subsea control system withstands even high vibrations and shocks against the subsea control system. The wedged plate is a plate which is pressed and clamped, respectively, by the screw against the socket and at least the one memory card, respectively, so that the at least one memory card is absolutely fixed in the socket of the computer unit.

The wedged plate covers at least a part of the socket where the memory card is placed. The wedged plate may cover the complete socket. This enables an absolutely secure hold of the at least one memory card in the socket and therefore a stable operation of the subsea control system. The socket may be a recess in the computer unit. In some embodiments, one memory card fits in one socket. Therefore the dimension of one socket may be a little bit larger than the dimension of a memory card.

Such a subsea control system can operate in rough environments, in particular in high pressure environments subsea. The secure hold of the at least one memory card at the subsea control system enables a durable operation of the subsea control system and a secure data exchange from and to the embedded computer unit of the subsea control system. Using a wedged plate and a screw for fixing the wedged plate to cover the at least one memory card placed in the socket of the computer unit is mechanically easy and not very cost-effective.

According to a further embodiment the screw hole of the subsea control system is part of the printed circuit board of the computer unit. The printed circuit board is used to mechanically support and electrically connect electronic components using conductive pathways, tracks or signal traces etched from copper sheets laminated onto a non-conductive substrate. The screw hole may be arranged at a part of the printed circuit board where no electronic conductions and elements are placed.

According to a further embodiment the subsea control system can comprise two sockets which are arranged next to each other, whereby the screw hole is arranged next to both sockets for fixing two memory cards wherein each memory card is placed in one of the sockets. In some embodiments, the screw hole is arranged between the two sockets. Such an arrangement of the screw hole enables that the wedged plate can easily cover both sockets and therefore both memory cards placed the sockets. Only one wedged plate and one screw are necessary to fix two or even more memory cards at the computer unit of the subsea control system. The wedged plate prevents the memory cards of falling out of the corresponding socket in the computer unit. The wedged plate may be screwed between the memory cards in such a way that both cards are held save in place. Arranging the screw hole between the two sockets enables the use of only one wedged plate for the fixation of two memory cards.

In some embodiments the wedged plate wedges and clamps, respectively, the at least one memory card in the socket of the computer unit. That means, the at least one memory card is pressed into the socket by the wedged plate and the screw, respectively. As the at least one memory card is held very secure in the socket the subsea control system can withstand even vibrations or shocks.

According to a further embodiment the subsea control system can be wherein two or more screws are screwed into a second or further screw hole for fixing the at least one memory card placed in the socket(s). The fixation of the wedges plate by two or more screws enables a very secure hold of the at least one memory card in the socket(s) of the computer unit.

In a further embodiment the wedged plate seals the at least one memory card in the socket.

In some embodiments the at least one memory card is a PC Card, e.g., a CompactFlash Card, a Smart Card, a Miniature Card or a Secure Digital Card. The memory card or flash card may comprise an electronic flash memory data storage device used for storing digital information.

Some embodiments provide a subsea control system which is embedded into a pressure-proof housing, e.g., a high pressure-proof housing. This may enable a save and secure operation of a subsea control system even in depth of 2000 or more meters.

FIG. 1 shows a subsea control system 1 with a computer unit 2 according to an example embodiment. The computer unit 2 comprises a printed circuit board 3 that contains a central processing unit 4. The computer unit 2 further comprises two sockets 5 for holding two memory cards 6. The computer unit 2 has a screw hole 7 for receiving a screw. The screw hole 7 is arranged between the two sockets 5, so that a wedged plate can cover both sockets 2, see FIG. 2.

FIG. 2 shows a wedged plate 8 which is fixed above a part of each socket 5. The wedged plate 8 is fixed to the computer unit 2 and printed circuit board 3, respectively, by a screw 9 which is screwed into the screw hole 7. The wedged plate 8 fixes the two memory cards 6, whereby each memory card 6 is placed in one socket 5.

Such a subsea control system 1 can operate in rough environments, in particular in high pressure environments subsea. The secure hold of the memory cards 6 at the subsea control system 1 enables a durable operation of the subsea control system 1 and a secure data exchange from and to the embedded computer unit 2 of the subsea control system 1. Using a wedged plate 8 and a screw 9 for fixing the wedged plate 8 to cover the memory cards is mechanically easy and not very cost-effective.

The wedged plate 8 may be basically a rectangular plate that is bent by a 90 degree angle. In other words the wedged plate 8 is a like a part of a hollow cuboid with only two sides present. In FIG. 2 one of these two sides can be seen and is located in the drawing plane. The second side would be perpendicular to this plane and would be directed to the viewer of the drawing. From a side view, the wedged plate 8 would be in L-form.

The wedged plate 8 may also be in V-shape.

The wedged plate 8 may allow to apply a continuous tensioning force to the at least one memory card. The wedged plate 8 may be a plate which is pressed and clamped, respectively, by the screw and/or a second component, at which a part of the wedged plate 8 applies a continuous force, against the socket and/or at least the one memory card, so that the at least one memory card is absolutely fixed in the socket of the computer unit.

What is claimed is:

1. Subsea control system comprising:
    a computer unit comprising:
        a printed circuit board including a central processing unit and
        a socket configured to hold at least one memory card,
        a screw hole, and
        a wedged plate fixed above at least a part of the socket by a screw that is screwed into the screw hole to fix the at least one memory card placed in the socket,
    wherein the subsea control system is embedded in a pressure-proof housing.

2. Subsea control system of claim 1, wherein the screw hole is part of the printed circuit board.

3. Subsea control system of claim 1, wherein two sockets are arranged next to each other and wherein the screw hole is arranged next to both sockets for fixing two memory cards in the two sockets.

4. Subsea control system of claim 3, wherein the screw hole is arranged between the two sockets.

5. Subsea control system of claim 1, wherein the wedged plate wedges the at least one memory card in the socket.

6. Subsea control system of claim 1, wherein two or more screws are screwed in a further screw hole for fixing the at least one memory card in the socket.

7. Subsea control system of claim 1, wherein the wedged plate seals the at least one memory card in the socket.

8. Subsea control system of claim 1, wherein the at least one memory card comprises a PC Card.

9. Subsea control system of claim 8, wherein the at least one memory card comprises at least one of a CompactFlash Card, a Smart Card, a Miniature Card, and a Secure Digital Card.

10. Subsea control system of claim 9, wherein the bent wedged plate has an L-shape or a V-shape.

11. Subsea control system of claim 1, wherein the wedged plate is a bent plate configured to apply a continuous tensioning force to the at least one memory card.

* * * * *